United States Patent
Lee (10) Patent No.: US 10,035,702 B2
(45) Date of Patent: Jul. 31, 2018

(54) CMOS-MEMS INTEGRATED DEVICE WITH SELECTIVE BOND PAD PROTECTION

(71) Applicant: INVENSENSE, INC., San Jose, CA (US)

(72) Inventor: Daesung Lee, Palo Alto, CA (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 15/356,916

(22) Filed: Nov. 21, 2016

(65) Prior Publication Data

US 2017/0066648 A1  Mar. 9, 2017

Related U.S. Application Data (63) Continuation of application No. 14/699,938, filed on Apr. 29, 2015, now Pat. No. 9,505,609.

(51) Int. Cl.
*B81C 1/00* (2006.01)
*B81B 7/00* (2006.01)

(52) U.S. Cl.
CPC ........ *B81C 1/00801* (2013.01); *B81B 7/0025* (2013.01); *B81B 2207/07* (2013.01); *B81C 2201/053* (2013.01); *B81C 2203/0785* (2013.01)

(58) Field of Classification Search
CPC .................................. B81C 1/00238
See application file for complete search history.

(56) References Cited

U.S. PATENT DOCUMENTS

2012/0211845 A1  8/2012  Daamen et al.
2016/0031704 A1* 2/2016  Shen .................. B81C 1/00238
                                                    257/416

OTHER PUBLICATIONS

Office Action dated Mar. 23, 2016 for U.S. Appl. No. 14/699,938, 11 pages.

* cited by examiner

*Primary Examiner* — Mamadou Diallo
(74) *Attorney, Agent, or Firm* — Amin, Turocy & Watson (57) ABSTRACT

A method and system for preparing a semiconductor wafer are disclosed. In a first aspect, the method comprises providing a passivation layer over a patterned top metal on the semiconductor wafer, etching the passivation layer to open a bond pad in the semiconductor wafer using a first mask, depositing a protection layer on the semiconductor wafer, patterning the protective layer using a second mask, and etching the passivation layer to open other electrodes in the semiconductor wafer using a third mask. The system comprises a MEMS device that further comprises a first substrate and a second substrate bonded to the first substrate, wherein the second substrate is prepared by the aforementioned steps of the method.

20 Claims, 10 Drawing Sheets

CMOS-MEMS INTEGRATED DEVICE WITH SELECTIVE BOND PAD PROTECTION

PRIORITY CLAIM

This patent application is a continuation application that claims priority to U.S. patent application Ser. No. 14/699,938, filed Apr. 29, 2015, entitled "CMOS-MEMS INTEGRATED DEVICE WITH SELECTIVE BOND PAD PROTECTION," the entirety of which is incorporated by reference herein.

TECHNICAL FIELD

The present invention relates to microelectromechanical systems (MEMS) devices, and more particularly, to a complementary metal-oxide-semiconductor (CMOS)-MEMS integrated device with selective bond pad protection.

BACKGROUND

Microelectromechanical systems (MEMS) devices are produced using various backend process modules. Conventional backend process modules suffer from bond pad corrosion issues that result in wire bonding failures thereby rendering the MEMS devices non-functional. Therefore, there is a strong need for a solution that overcomes the aforementioned issues. The present invention addresses such a need.

SUMMARY

A method and system for preparing a semiconductor wafer are disclosed. In a first aspect, the method comprises providing a passivation layer over a patterned top metal on the semiconductor wafer, etching the passivation layer to open a bond pad in the semiconductor wafer using a first mask, depositing a protection layer on the semiconductor wafer, patterning the protective layer using a second mask, and etching the passivation layer to open other electrodes in the semiconductor wafer using a third mask.

In a second aspect, the method comprises providing a passivation layer over a patterned top metal on the semiconductor wafer, etching the passivation layer to open a bond pad in the semiconductor wafer using a first mask, depositing a protection layer on the semiconductor wafer, wherein the protection layer is the same material as the passivation layer, and etching the passivation layer to open other electrodes in the semiconductor wafer using a second mask.

In a third aspect, the method comprises providing a passivation layer over a patterned top metal on the semiconductor wafer, etching the passivation layer to partially open a bond pad in the semiconductor wafer using a first mask, and etching the passivation layer to open other electrodes in the semiconductor wafer using a second mask.

In a fourth aspect, the method comprises providing a passivation layer over a patterned top metal on the semiconductor wafer, etching the passivation layer to open a bond pad and other electrodes in the semiconductor wafer at the same time using a first mask, depositing a protection layer on the semiconductor wafer, and etching the protection layer to open other electrodes in the semiconductor wafer using a second mask.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

The present invention relates to microelectromechanical systems (MEMS) devices, and more particularly, to a complementary metal-oxide-semiconductor (CMOS)-MEMS integrated device with selective bond pad protection. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

In MEMS devices, a port is an opening through a substrate to expose MEMS structure to the surrounding environment. A chip includes at least one substrate typically formed from a semiconductor material. A single chip may be formed from multiple substrates, wherein the substrates are mechanically bonded to preserve functionality. Multiple chips include at least two substrates, wherein the at least two substrates are electrically connected but do not require mechanical bonding.

Typically, multiple chips are formed by dicing wafers. MEMS wafers are silicon wafers that contain MEMS structures. MEMS structures may refer to any feature that may be part of a larger MEMS device. One or more MEMS features comprising moveable elements is a MEMS structure. MEMS features may refer to elements formed by a MEMS fabrication process such as bump stop, damping hole, via, port, plate, proof mass, standoff, spring, and seal ring.

MEMS substrates provide mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. Bonding may refer to methods of attaching and the MEMS substrate and an integrated circuit (IC) substrate may be bonded using a eutectic bond (e.g., AlGe, CuSn, AuSi), fusion bond, compression, thermocompression, adhesive bond (e.g., glue, solder, anodic bonding, glass frit). An IC substrate may refer to a silicon substrate with electrical circuits, typically CMOS circuits. A package provides electrical connection between bond pads on the chip to a metal lead that can be soldered to a printed board circuit (PCB). A package typically comprises a substrate and a cover.

Complementary metal-oxide-semiconductor (CMOS)-MEMS integrated devices include a CMOS-MEMS backend process that may require photolithography and patterning on the ground surface of the CMOS or the MEMS wafers/substrates that make up the CMOS-MEMS integrated device. A CMOS-MEMS backend process covers all remaining steps after the bonding of the CMOS and the MEMS wafers to each other.

During the CMOS-MEMS backend process, bond pads (typically made from aluminum-copper AlCu) are exposed to the outer environment (e.g., wet chemicals, film deposition, etch, etc.) through the channels from the edge of the bonded wafer where there is no wafer-level seal. Core devices (e.g., accelerometers, gyroscopes, pressure sensors, etc.) are sealed completely at the die level. To be compatible with a tab dicing module and process that exposes the bond pads to the outer environment (after the wafers are bonded together) and thereby enables wafer level testing, it is advantageous to not implement a wafer-level seal.

For CMOS-MEMS integrated devices that have a minimal backend process consisting of MEMS grinding, CMOS grinding, MEMS side metallization, and tab dicing, applying a self-assembled monolayers (SAM) coating as a protection/protective layer on the bond pad(s) after the CMOS-MEMS bonding through the channels from the edge of the wafer generally enables the bond pad(s) to survive the minimal backend process. In this conventional embodiment, the SAM coating is typically applied to the bond pad immediately after the wafer bonding but before the tab dicing.

However, additional bond pad protection must be employed when the backend process is not as minimal and is more detailed because it employs wet steps that can degrade and remove away the SAM coating from the bond pad. Typical bond pads made from AlCu (and other typical bond pad materials) can be easily corroded from the wet steps during the more detailed backend process. Specifically, wet chemicals can be trapped on the bond pads through the channels from the edge of the wafer.

Therefore, for CMOS-MEMS integrated devices that have a more detailed CMOS-MEMS backend process, the conventional method of merely depositing the SAM coating type of protection layer right after the CMOS-MEMS bonding through the channels from the edge of the wafer is not advantageous and does not protect the bond pad. In this conventional embodiment, the SAM coating does not survive the more detailed backend process (e.g., wet steps comprising any of wet photoresist strips, deionized (DI) water, isopropyl alcohol (IPA), and any combination thereof, etc.) which results in bond pad defects (e.g., corrosion, discoloration, etc.) that causes wire bondability issues and yield reductions.

A method and system in accordance with the present invention provides for uniformly depositing a different type of protection layer (not just a SAM coating) across the CMOS wafer of the CMOS-MEMS integrated device before the bonding of the CMOS wafer to the MEMS wafer (and thus before the tab dicing). In one embodiment, the protection layer includes but is not limited to an oxide layer, a silicon nitride (SiN) layer, and a titanium nitride (TiN) layer. In another embodiment, the protection layer includes other materials that do not degrade when in contact with the wet steps (e.g., wet chemicals) of the more detailed backend process.

In the method and system in accordance with the present invention, the protection layer (that is stronger than a typical SAM coating) is then selectively etched away after the bonding of the CMOS-MEMS wafers, the more detailed backend process is completed. Therefore, the protection layer protects the bond pad against the wet steps and is then removed after the wet steps are completed to provide a CMOS-MEMS integrated device that withstands against bond pad defects.

In one embodiment, a method and system in accordance with the present invention provides for preparing of the semiconductor (e.g., CMOS) wafer by selectively providing and leaving the protection layer (e.g., oxide, SiN, TiN layers, etc.) on at least one bond pad in the CMOS wafer where the impact on the rest of the areas (especially devices inside the seal) is minimal. The CMOS wafer is then bonded to the MEMS wafer. The bonded CMOS-MEMS wafer goes through the more detailed backend process that includes wet steps and tab dicing. After the tab dicing wherein the bond pad area is exposed from the top, the protection layer on the bond pad that does not degrade from the wet steps, is selectively etched away (e.g., including but not limited to isotropic and anisotropic etching).

To describe the features of the present invention in more detail, refer now to the following description in conjunction with the accompanying Figures.

Figure 1A:
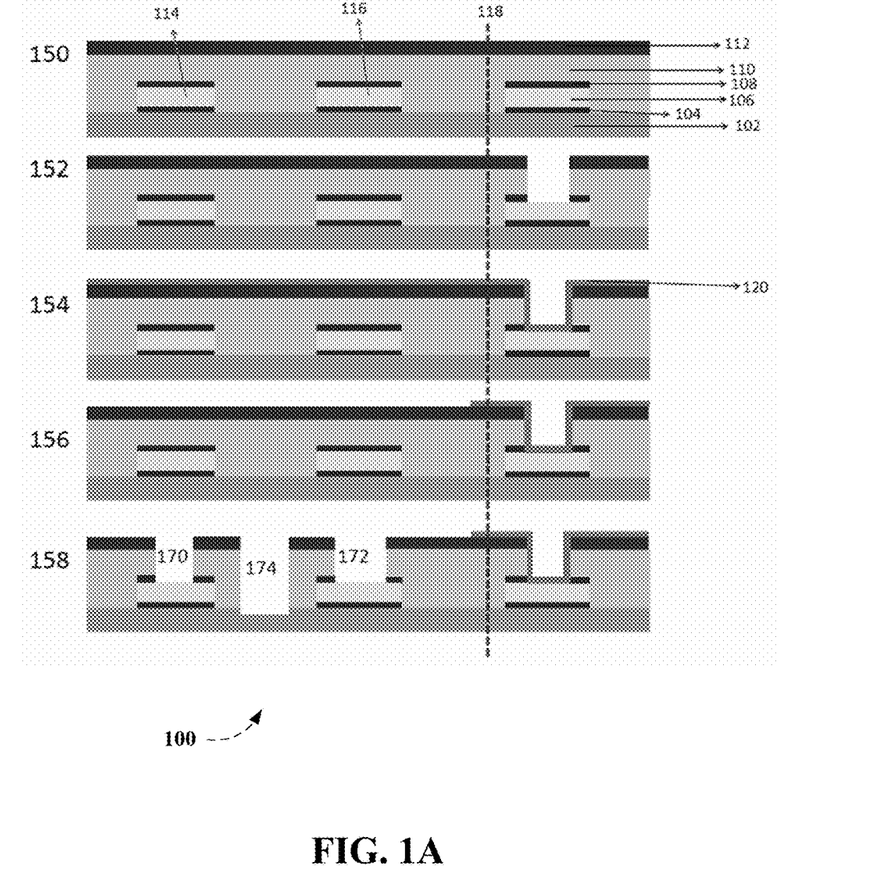
FIG. 1A illustrates a first part of a method for preparing the semiconductor wafer in accordance with a first embodiment.

FIG. 1A illustrates a first part of a method 100 for preparing a semiconductor wafer in accordance with a first embodiment. In one embodiment, the semiconductor wafer is a CMOS wafer. The semiconductor wafer comprises an intermetal dielectric layer (IDL) 102, an under layer 104, an electrode 106 for a bond pad, an anti-reflective/reflection coating layer 108, an oxide layer 110, a top passivation layer 112, an electrode 114 inside a seal ring, and an electrode 116 for a bond seal.

In one embodiment, the under layer 104 comprises titanium (Ti) or a titanium/titanium nitride (Ti/TiN) compound, the electrode 106 for the bond pad comprises aluminum-copper (AlCu), the anti-reflective coating layer 108 comprises any of TiN, Ti/TiN, a tantalum nitride (TaN) compound, and a titanium/tungsten (TiW) compound, and the top passivation layer 112 comprises silicon nitride (SiN). In one embodiment, a top metal of the semiconductor wafer comprises the following three layers: under layer 104, the electrode 106 for the bond pad, and the anti-reflective coating layer 108. In one embodiment, the passivation layer comprises both of the following layers: the oxide layer 110 and the top passivation layer 112.

In the method 100, both the top passivation layer 112 and the oxide layer 110 (the entire passivation layer) are deposited over a patterned top metal of the semiconductor wafer, via step 150. Etching is utilized to fully expose or open the bond pad using a first mask (e.g., PAD1 mask), via step 152. The bond pad is fully exposed because each of the top passivation layer 112, the oxide layer 110, and the anti-reflective coating layer 108 are etched away during the first etching process. A protection/protective layer 120 (e.g., including but not limited to an oxide layer, SiN layer, TiN layer) is deposited on the top passivation layer 112, via step 154. The protection layer 120 is patterned using a second mask (e.g., mask A), via step 156. After the patterning using the second mask, via step 156, the protection layer 120 is left only on the bond pad and the surrounding areas.

In the method 100, a passivation etch (e.g., passivation layer+TiN on AlCu) is applied to the semiconductor wafer using a third mask (e.g., PAD2 mask), via step 158, to pattern the rest of the area (inside the seal and along the seal) to open sensing electrodes (the electrode 114 inside the seal ring), and other electrodes (the electrode 116 for the bond seal), to provide a bonding area above the electrode 116 for the bond seal (or the bonding of the semiconductor/CMOS wafer with a MEMS wafer to create the CMOS-MEMS integrated device). In this embodiment, the electrode 114 is both inside the seal ring and a sensing electrode. In another embodiment, the electrode 114 is only inside the seal ring and not a sensing electrode.

In one embodiment, three areas are etched by the passivation etch via step 158: a first area 170—near the electrode 114 inside the seal ring, a second area 172 (the bonding area)—near the electrode 116 for the bond seal, and a third area 174 in between the electrodes 114-116. The third area 174 that is etched actually provides an etching that goes into a portion of the IDL 102.

Figure 1B:
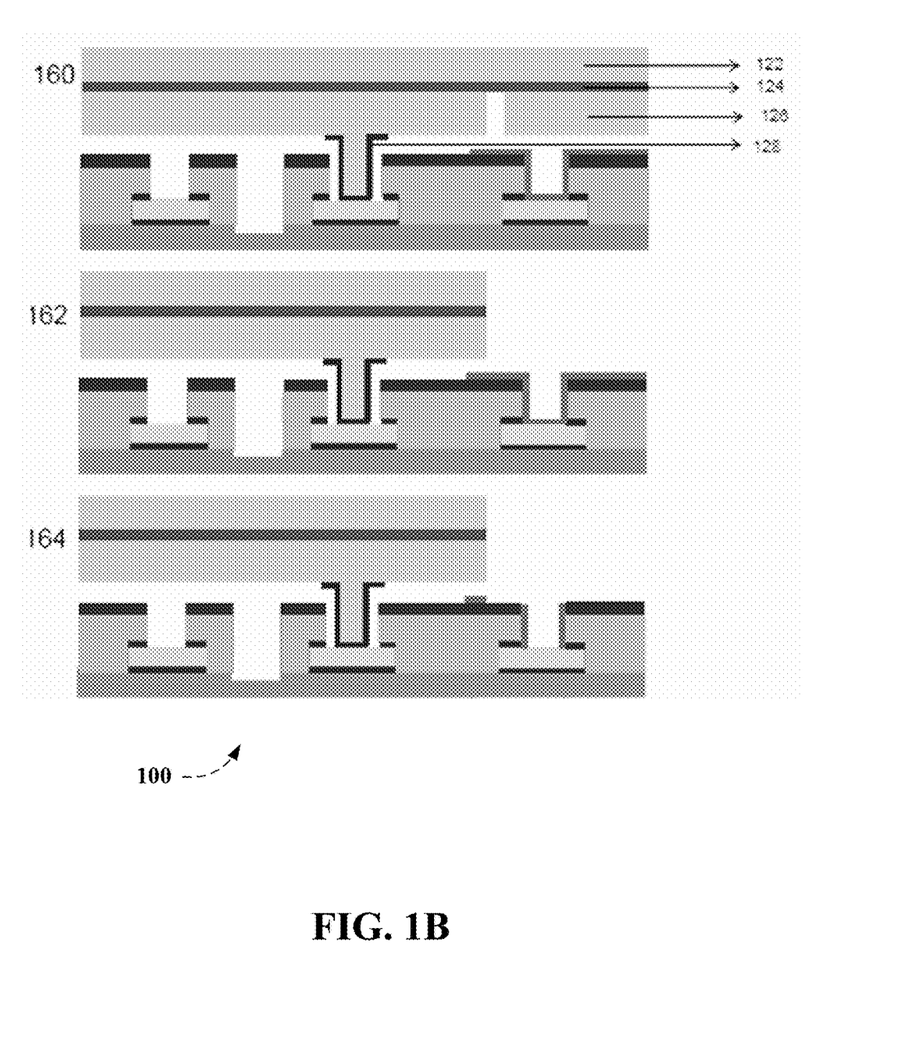
FIG. 1B illustrates a second part of the method for preparing the semiconductor wafer in accordance with the first embodiment.

FIG. 1B illustrates a second part of the method 100 for preparing the semiconductor wafer in accordance with the first embodiment. The CMOS wafer is bonded to the MEMS wafer, via step 160. The MEMS wafer comprises a MEMS handle 122, a fusion bond oxide layer 124, a MEMS device layer 126, and a bonding layer 128. After the CMOS wafer has been bonded to the MEMS wafer via step 160 and the more detailed backend process that includes wet steps is conducted, the bond pad area is exposed from the top using tab dicing along the tab dicing line 118, via step 162. The protection layer 120 is then selectively etched without using a mask, via step 164.

In one embodiment, the selective etching is a blanket directional etch. In another embodiment, the selective etching is an isotropic etch. The etch recipe/process is chosen to have good selectivity to the top passivation layer 112 (e.g., SiN) and bond pad (e.g., AlCu) to minimize the loss of the top passivation layer 112 and the bond pad.

In another embodiment, the protection layer 120 near the electrode 114 inside the seal ring is selectively etched and patterned in a similar fashion to the protection layer 120 near the electrode 106 for the bond pad at the same time. In this embodiment, to provide the similar protection layer 120 patterns, an opening is etched for the electrode 114 inside the seal ring using a similar process to step 152 where the etching exposes or opens the electrode 106 for the bond pad using the same first mask. This embodiment can potentially enable more device functionality. This embodiment is only utilized when the protection layer 120 can also serve as other functional layers for the MEMS device operations and performance enhancements of the MEMS device.

A conventional process module or flow, where there is no bond pad protection in the semiconductor/CMOS wafer before the bonding to the MEMS wafer, only uses a single mask (PAD=PAD1 disjoint union PAD2) to pattern the passivation layer on the CMOS wafer. As aforementioned, the application of a protection layer such as a SAM coating after the bonding of the CMOS and MEMS wafers and before the backend process leaves the bond pad susceptible to corrosion and other issues because the SAM coating does not properly protect against the backend process wet steps.

Comparatively, the method 100 requires two additional masks compared to the conventional process module. The two additional masks enable the protection layer to be uniformly applied across the entire top passivation layer of the CMOS wafer as well as a top layer of the bond pad and also enable the protection layer to be selectively removed after both the bonding of the CMOS and MEMS wafers and the backend process is completed which mitigates against the bond pad defect issues.

Figure 2A:
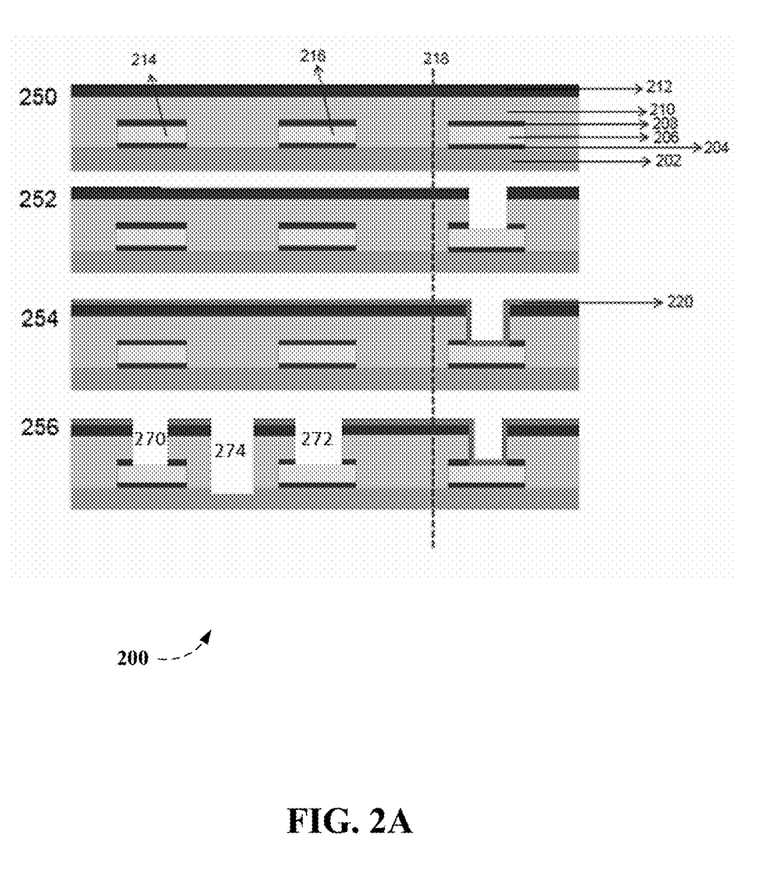
FIG. 2A illustrates a first part of a method for preparing the semiconductor wafer in accordance with a second embodiment.

FIG. 2A illustrates a first part of a method 200 for preparing a semiconductor wafer in accordance with a second embodiment. In one embodiment, the semiconductor wafer is a CMOS wafer. Similarly to FIG. 1A, the semiconductor wafer in FIG. 2A comprises an intermetal dielectric layer (IDL) 202, an under layer 204, an electrode 206 for a bond pad, an anti-reflective coating layer 208, an oxide layer 210, a top passivation layer 212, an electrode 214 inside a seal ring, and an electrode 216 for a bond seal.

In one embodiment, the under layer 204 comprises titanium (Ti) or a titanium/titanium nitride (Ti/TiN) compound, the electrode 206 for the bond pad comprises aluminum-copper (AlCu), the anti-reflective coating layer 208 comprises any of TiN, Ti/TiN, a tantalum nitride (TaN) compound, and a titanium/tungsten (TiW) compound, and the top passivation layer 212 comprises silicon nitride (SiN). In one embodiment, a top metal of the semiconductor wafer comprises the following three layers: under layer 204, the electrode 206 for the bond pad, and the anti-reflective coating layer 208. In one embodiment, the passivation layer comprises both of the following layers: the oxide layer 210 and the top passivation layer 212.

In the method 200, and similar to the steps 150-154 of the method 100, both the top passivation layer 212 and the oxide layer 210 are deposited over a patterned top metal of the semiconductor wafer, via step 250, etching is utilized to expose or open the bond pad using a first mask (e.g., PAD1 mask), via step 252, and a protection/protective layer 220 is deposited on the top passivation layer 212, via step 254. The bond pad is fully exposed because each of the top passivation layer 212, the oxide layer 210, and the anti-reflective coating layer 208 are etched away during the first etching process. However, in the method 200 and unlike the method 100, the protection layer 220 is made from the same material as the top passivation layer 212. Therefore, in the method 200, the step of patterning the protection layer 220 using a second mask is not utilized as it is in the method 100.

After the deposition of the protection layer 220, a passivation etch (e.g., passivation layer+TiN on AlCu) is applied to the semiconductor wafer using a second mask (e.g., PAD2 mask), via step 256, to pattern the rest of the area (inside the seal and along the seal) to open sensing electrodes (the electrode 214 inside the seal ring) and other electrodes (the electrode 216 for the bond seal), to provide a bonding area above the electrode 216 for the bond seal (or the bonding of the semiconductor/CMOS wafer with a MEMS wafer to create the CMOS-MEMS integrated device). In this embodiment, the electrode 214 is both inside the seal ring and a sensing electrode. In another embodiment, the electrode 214 is only inside the seal ring and not a sensing electrode.

In one embodiment, three areas are etched by the passivation etch via step 256: a first area 270—near the electrode 214 inside the seal ring, a second area 272 (the bonding area)—near the electrode 216 for the bond seal, and a third area 274 in between the electrodes 214-216. The third area 274 that is etched actually provides an etching that goes into a portion of the IDL 202.

Figure 2B:
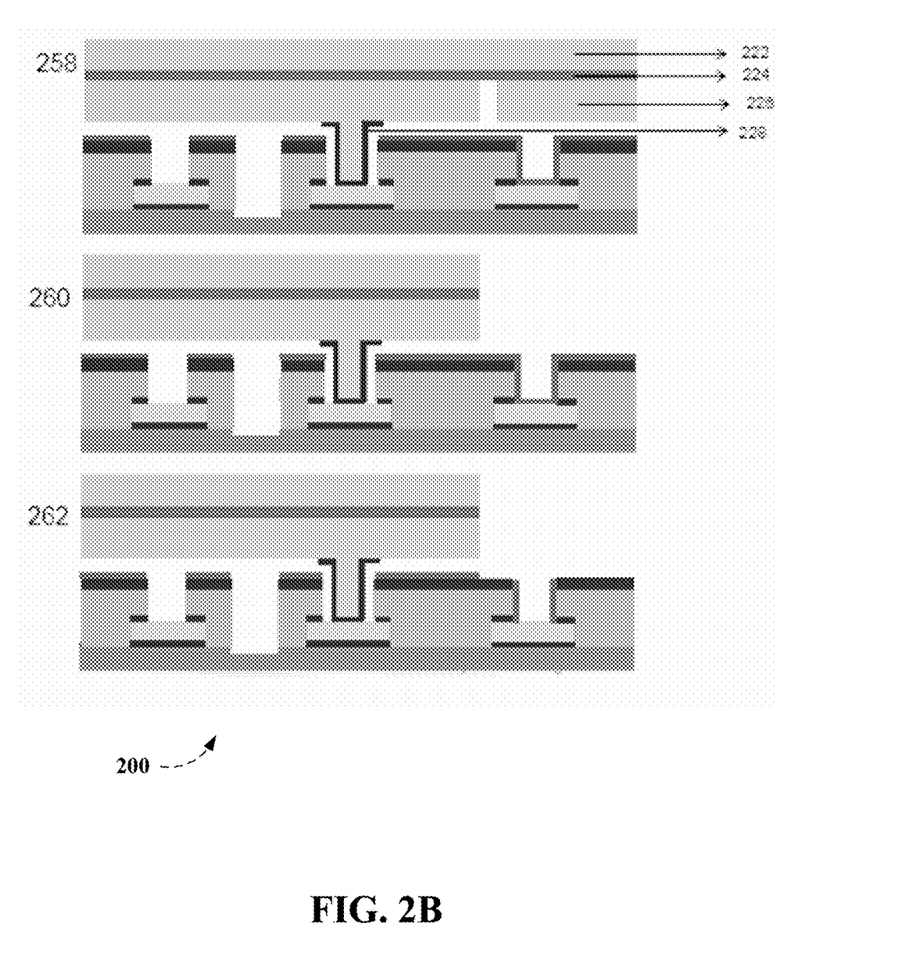
FIG. 2B illustrates a second part of the method for preparing the semiconductor wafer in accordance with the second embodiment.

FIG. 2B illustrates a second part of the method 200 for preparing the semiconductor wafer in accordance with the second embodiment. The CMOS wafer is bonded to the MEMS wafer, via step 258. Similarly to FIG. 1B, the MEMS wafer in FIG. 2B comprises a MEMS handle 222, a fusion bond oxide layer 224, a MEMS device layer 226, and a bonding layer 228. After the CMOS wafer has been bonded to the MEMS wafer via step 258 and the more detailed backend process that includes wet steps is conducted, the bond pad area is exposed from the top using tab dicing along the tab dicing line 218, via step 260. The protection layer 220 is then selectively etched without using a mask, via step 262.

In one embodiment, the selective etching is a blanket directional etch. In another embodiment, the selective etching is an isotropic etch. The etch recipe/process is chosen to have good selectivity to the top passivation layer 212 (e.g., SiN) and bond pad (e.g., AlCu) to minimize the loss of the top passivation layer 212 and the bond pad.

In another embodiment, the protection layer 220 near the electrode inside the seal ring 214 is selectively etched and patterned in a similar fashion to the protection layer 220 near the electrode 206 for the bond pad. In this embodiment, to provide the similar protection layer 220 patterns, an opening is etched for the electrode 214 inside the seal ring using a similar process to step 252 where the etching exposes or opens the electrode 206 for the bond pad using the same first mask. This embodiment can potentially enable more device functionality. This embodiment is only utilized when the protection layer 220 can also serve as other functional layers for the MEMS device operations and performance enhancements of the MEMS device.

Compared to the method 100, the method 200 only includes two masks (instead of three masks in the method 100) and thus only utilizes one additional mask (instead of the two additional masks in the method 100) over the conventional process module. By utilizing the same material for both the top passivation layer 212 and the protection layer 220, the method 200 does not include a separate patterning step of the protection layer 220 and thus reduces the number of steps required to mitigate against bond pad defects resulting from a more detailed backend process.

Figure 3A:
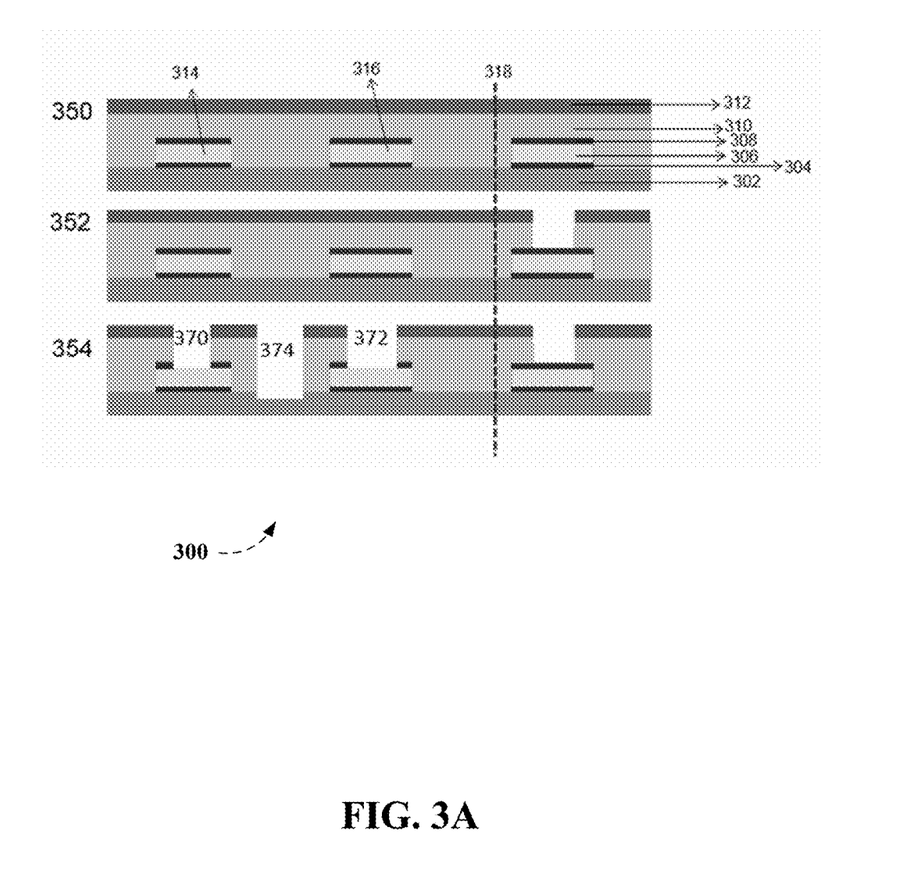
FIG. 3A illustrates a first part of a method for preparing the semiconductor wafer in accordance with a third embodiment.

FIG. 3A illustrates a first part of a method 300 for preparing a semiconductor wafer in accordance with a third embodiment. In one embodiment, the semiconductor wafer is a CMOS wafer. Similarly to FIG. 1A, the semiconductor wafer in FIG. 3A comprises an intermetal dielectric layer (IDL) 302, an under layer 304, an electrode 306 for a bond pad, an anti-reflective coating layer 308, an oxide layer 310, a top passivation layer 312, an electrode 314 inside a seal ring, and an electrode 316 for a bond seal.

In one embodiment, the under layer 304 comprises titanium (Ti) or a titanium/titanium nitride (Ti/TiN) compound, the electrode 306 for the bond pad comprises aluminum-copper (AlCu), the anti-reflective coating layer 308 comprises any of TiN, Ti/TiN, a tantalum nitride (TaN) compound, and a titanium/tungsten (TiW) compound, and the top passivation layer 312 comprises silicon nitride (SiN). In one embodiment, a top metal of the semiconductor wafer comprises the following three layers: under layer 304, the electrode 306 for the bond pad, and the anti-reflective coating layer 308. In one embodiment, the passivation layer comprises both of the following layers: the oxide layer 310 and the top passivation layer 312.

In the method 300, and similar to the steps 150-152 of the method 100 and the steps 250-252 of the method 200, both the top passivation layer 312 and the oxide layer 310 are deposited over a patterned top metal of the semiconductor wafer, via step 350, and etching is utilized to partially expose or open the bond pad using a first mask (e.g., PAD1 mask), via step 352. The bond pad is partially exposed because the first etching does not remove the anti-reflective coating layer 308. However, in the method 300 and unlike the methods 100 and 200, a protection/protective layer is not deposited on the top passivation layer 312.

Instead, in the method 300, after the first etching of both the top passivation layer 312 and the oxide layer 310 that partially opens the bond pad, the top passivation layer 312, the oxide layer 310, and the anti-reflective coating layer 308 above the electrode 314 inside the seal ring and the electrode 316 for the bond seal are all etched using a second mask (e.g., PAD2 mask), via step 354. In the step 354, the etching goes through the anti-reflective coating layer 308 (e.g., TiN layer) that is on top of the AlCu layer of the electrodes 314-316. Thus, and as seen in FIG. 3A, the etching of the top passivation layer 312 via step 354 patterns the rest of the area of the semiconductor wafer (inside the seal and along the seal).

In one embodiment, three areas are etched by the etching of the top passivation layer 312 via step 354: a first area 370—near the electrode 314 inside the seal ring, a second area 372 (the bonding area)—near the electrode 316 for the bond seal, and a third area 374 in between the electrodes 314-316. The third area 374 that is etched actually provides an etching that goes into a portion of the IDL 302.

In the method 300, the anti-reflective coating layer 308 that can be made of TiN serves as the protection/protective layer. The etching process of the step 352 leaves the anti-reflective coating layer 308 on the bond pad for protection of the bond pad. On the other hand, the anti-reflective coating layer 308 is removed from the other two electrodes (314, 316) during the etching process of the step 354.

Figure 3B:
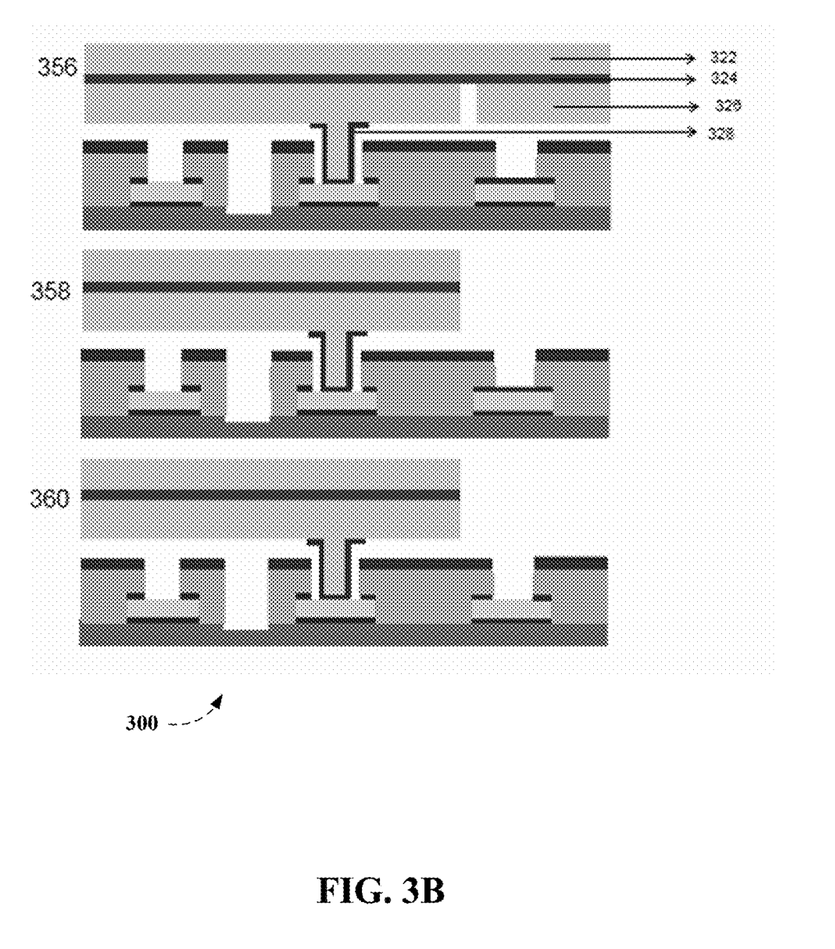
FIG. 3B illustrates a second part of the method for preparing the semiconductor wafer in accordance with the third embodiment.

As aforementioned, the top metal area of the semiconductor wafer typically comprises the under layer 304, the electrode 306 for the bond pad, and the anti-reflective coating layer 308. In one embodiment, the top metal area formulates a stack of materials comprising TiN/AlCu/TiN and the top TiN layer is left alone above the bond pad but is removed from the other two electrodes by the etching process 354. FIG. 3B illustrates a second part of the method 300 for preparing the semiconductor wafer in accordance with the third embodiment. The CMOS wafer is bonded to the MEMS wafer, via step 356. Similarly to FIG. 1B, the MEMS wafer in FIG. 3B comprises a MEMS handle 322, a fusion bond oxide layer 324, a MEMS device layer 326, and a bonding layer 328. After the CMOS wafer has been bonded to the MEMS wafer via step 356 and the more detailed backend process that includes wet steps is conducted, the bond pad area is exposed from the top using tab dicing along the tab dicing line 318, via step 358. The anti-reflective coating layer 308 that serves as the protection layer above the bond pad is then selectively etched without using a mask, via step 360.

In one embodiment, the selective etching is a blanket directional etch. In another embodiment, the selective etching is an isotropic etch. The etch recipe/process is chosen to have good selectivity to the top passivation layer 312 (e.g., SiN) and bond pad (e.g., AlCu) to minimize the loss of the top passivation layer 312 and the bond pad.

Compared to the method 100, the method 300 (similar to the method 200) only includes two masks (instead of three masks in the method 100) and thus only utilizes one additional mask (instead of the two additional masks in the method 100) over the conventional process module. By utilizing the anti-reflective coating layer 308 as the protection layer, the method 300 does not include the steps of depositing and patterning an additional protection layer and thus reduces the number of steps required to mitigate against bond pad defects resulting from a more detailed backend process. Furthermore, due to the absence of the deposition of an additional protection layer after the bond pad is opened via the first etching of step 352, there is no change in devices inside the seal ring in comparison to the conventional process module.

Figure 4A:
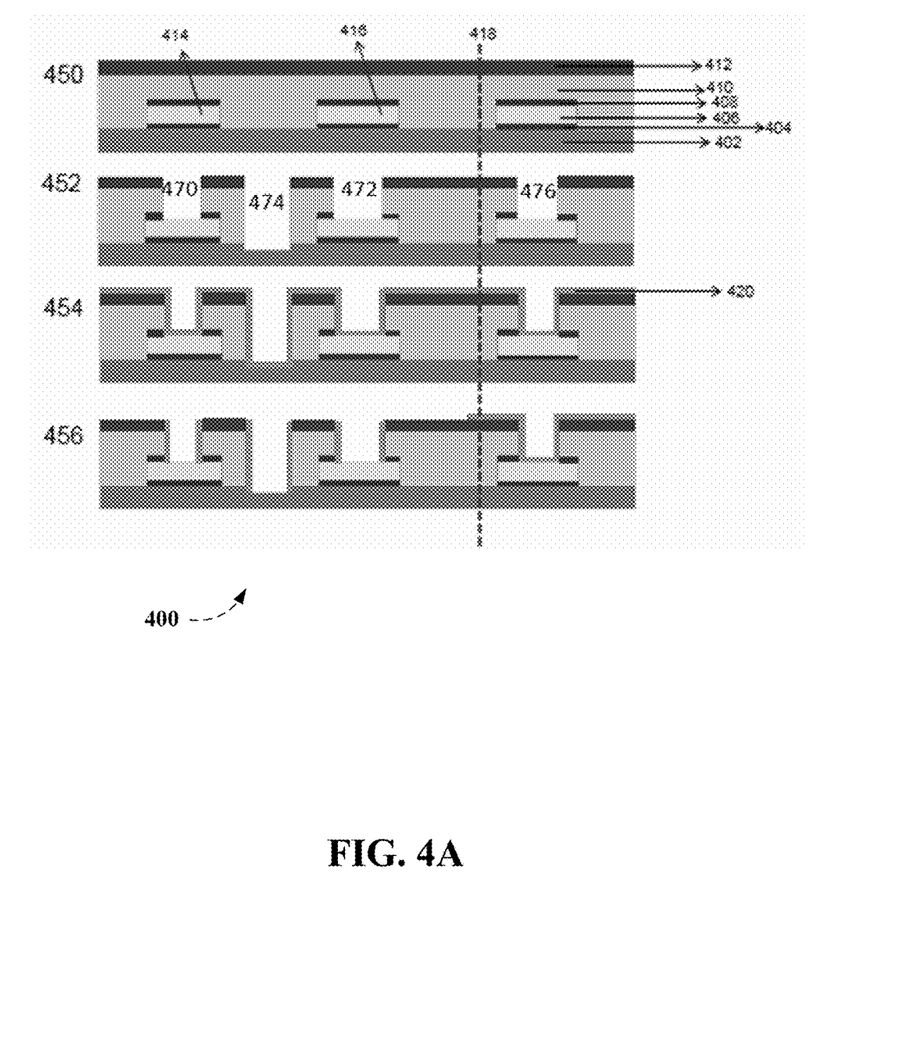
FIG. 4A illustrates a first part of a method for preparing the semiconductor wafer in accordance with a fourth embodiment.

FIG. 4A illustrates a first part of a method 400 for preparing a semiconductor wafer in accordance with a fourth embodiment. In one embodiment, the semiconductor wafer is a CMOS wafer. Similarly to FIG. 1A, the semiconductor wafer in FIG. 4A comprises an intermetal dielectric layer (IDL) 402, an under layer 404, an electrode 406 for a bond pad, an anti-reflective coating layer 408, an oxide layer 410, a top passivation layer 412, an electrode 414 inside a seal ring, and an electrode 416 for a bond seal.

In one embodiment, the under layer 404 comprises titanium (Ti) or a titanium/titanium nitride (Ti/TiN) compound, the electrode 406 for the bond pad comprises aluminum-copper (AlCu), the anti-reflective coating layer 408 comprises any of TiN, Ti/TiN, a tantalum nitride (TaN) compound, and a titanium/tungsten (TiW) compound, and the top passivation layer 412 comprises silicon nitride (SiN). In one embodiment, a top metal of the semiconductor wafer comprises the following three layers: under layer 404, the electrode 406 for the bond pad, and the anti-reflective coating layer 408. In one embodiment, the passivation layer comprises both of the following layers: the oxide layer 410 and the top passivation layer 412.

In the method 400, and similar to the step 150 of the method 100, step 250 of the method 200, and step 350 of the method 300, both the top passivation layer 412 and the oxide layer 410 are deposited over a patterned top metal of the semiconductor wafer, via step 450. However, in the method 400 and unlike the methods 100-200-300, the top passivation layer 412 is etched using a first mask (e.g., PAD1 mask), via step 452, and this first etching fully exposes all three electrodes and not just the area above the bond pad like the previous first etching process seen in the methods 100-200-300. The first etching removes the top passivation layer 412, the oxide layer 410, and the anti-reflective coating layer 408.

In one embodiment, four areas are etched via the etching process step 452: a first area 470—near the electrode 414 inside the seal ring, a second area 472 (a bonding area)—near the electrode 416 for the bond seal, a third area 474 in between the electrodes 414-416, a fourth area 476 above the electrode 406 for the bond pad. The third area 474 that is etched actually provides an etching that goes into a portion of the IDL 402.

In the method 400, the passivation etch via step 452 (e.g., passivation layer+TiN on AlCu) is applied to the semiconductor wafer to pattern the rest of the area (inside the seal and along the seal) and to open both the sensing electrodes (the electrode 414 inside the seal ring and the other electrodes (the electrode 416 for the bond seal) to provide the bonding area (second area 472) above electrode 416 for the bond seal (or the bonding of the semiconductor/CMOS wafer with a MEMS wafer to create the CMOS-MEMS integrated device). In this embodiment, the electrode 414 is both inside the seal ring and a sensing electrode. In another embodiment, the electrode 414 is only inside the seal ring and not a sensing electrode. The etching process of the step 452 removes the anti-reflective coating layer 408 from the bond pad as well as the other electrodes (414-416).

After the top passivation layer 412 is etched via step 452, the protection/protective layer 420 is deposited on the top passivation layer 412, via step 454. The protection layer 420 is patterned using a second mask (e.g., mask A), via step 456. After the patterning using the second mask, via step 456, the protection layer 420 is left only on the bond pad and the surrounding areas/vicinities. In comparison to the method 100, the patterning step 456 is more difficult due to the non-planar topography of the semiconductor wafer.

Figure 4B:
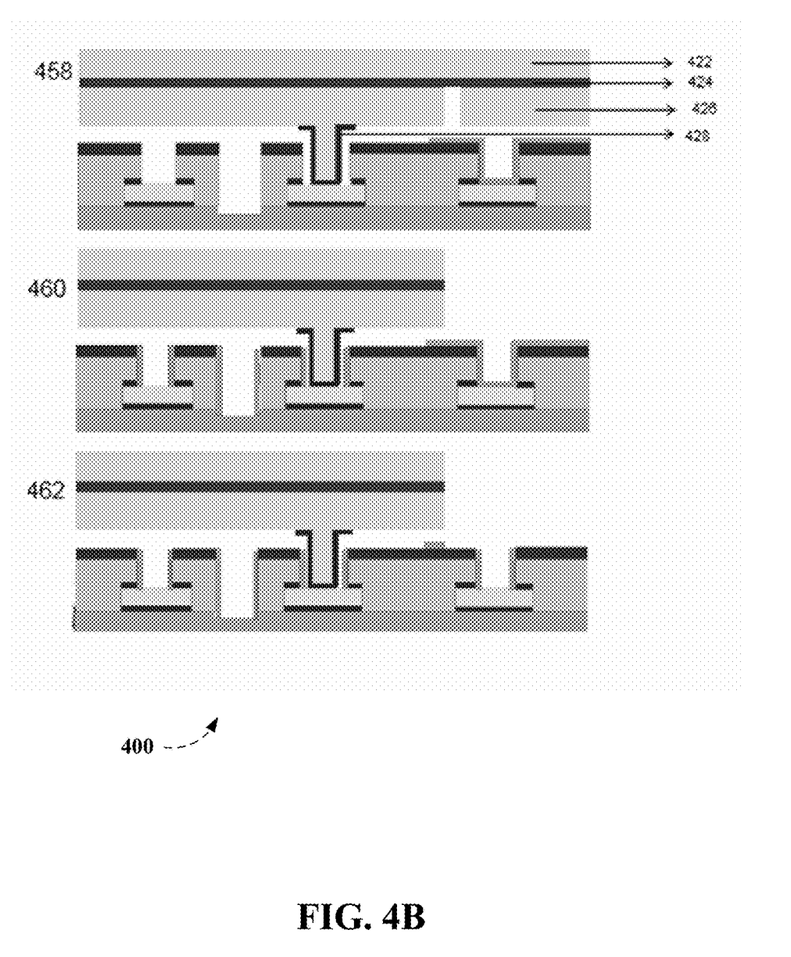
FIG. 4B illustrates a second part of the method for preparing the semiconductor wafer in accordance with the fourth embodiment.

FIG. 4B illustrates a second part of the method 400 for preparing the semiconductor wafer in accordance with the fourth embodiment. The CMOS wafer is bonded to the MEMS wafer, via step 458. Similarly to FIG. 1B, the MEMS wafer in FIG. 4B comprises a MEMS handle 422, a fusion bond oxide layer 424, a MEMS device layer 426, and a bonding layer 428. After the CMOS wafer has been bonded to the MEMS wafer via step 458 and the more detailed backend process that includes wet steps is conducted, the bond pad area is exposed from the top using tab dicing along the tab dicing line 418, via step 460. The protection layer 420 is then selectively etched without using a mask, via step 462.

In one embodiment, the selective etching is a blanket directional etch. In another embodiment, the selective etching is an isotropic etch. The etch recipe/process is chosen to have good selectivity to the top passivation layer 412 (e.g., SiN) and bond pad (e.g., AlCu) to minimize the loss of the top passivation layer 412 and the bond pad.

Compared to the method 100, the method 400 (similar to the methods 200 and 300) only includes two masks (instead of the three masks required in the method 100) and thus only utilizes one additional mask (instead of the two additional masks in the method 100) over the conventional process module.

In addition, in the method 400 and similar to the method 100, the protection layer 420 can be selectively etched to also be left over the top passivation layer 412 and the electrode 414 inside the seal ring which can potentially enable more device functionality. This embodiment is only utilized when the protection layer 420 can also serve as other functional layers for the MEMS device operations and performance enhancements of the MEMS device.

Figure 5:
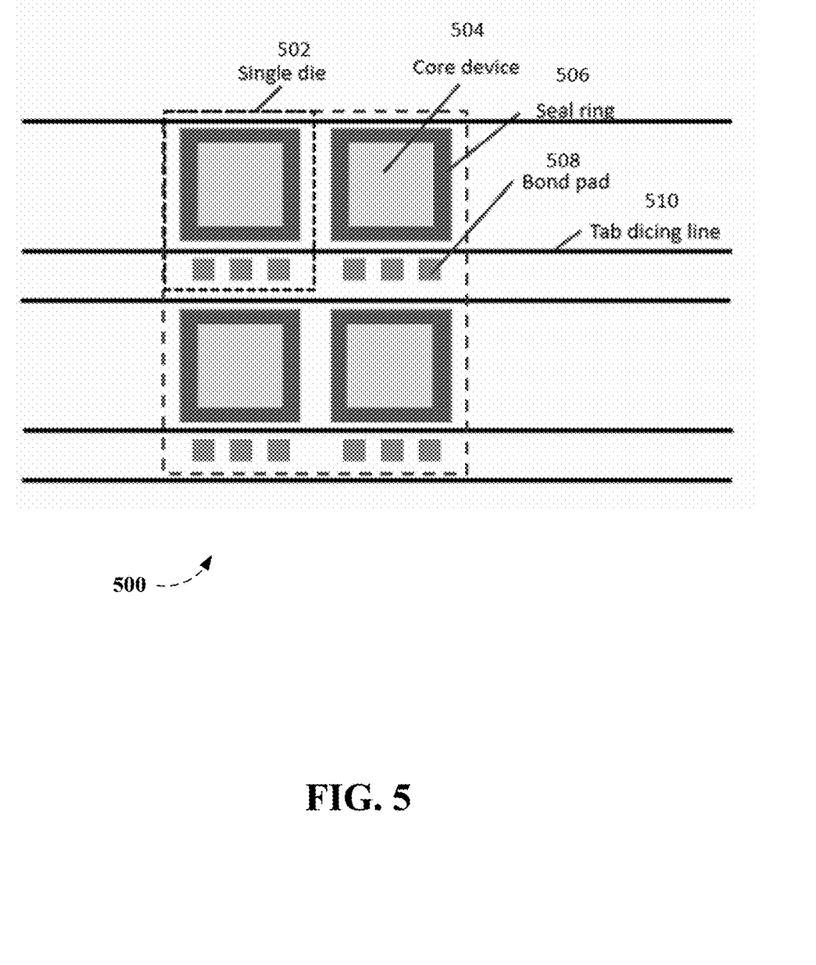
FIG. 5 illustrates a top view of a bonded wafer in accordance with an embodiment.

FIG. 5 illustrates a top view of a bonded wafer 500 in accordance with an embodiment. The bonded wafer 500 comprises a schematic of 2×2 dies. The bonded wafer 500 includes a core device 504, a seal ring 506 surrounding the core device 504, at least one bond pad 508, and denotes a tab dicing line 510 with dotted lines. In FIG. 5, a single die 502 encompasses (as shown by the dotted lines) the core device 504, the seal ring 506, and the at least one bond pad 508.

Figure 6:
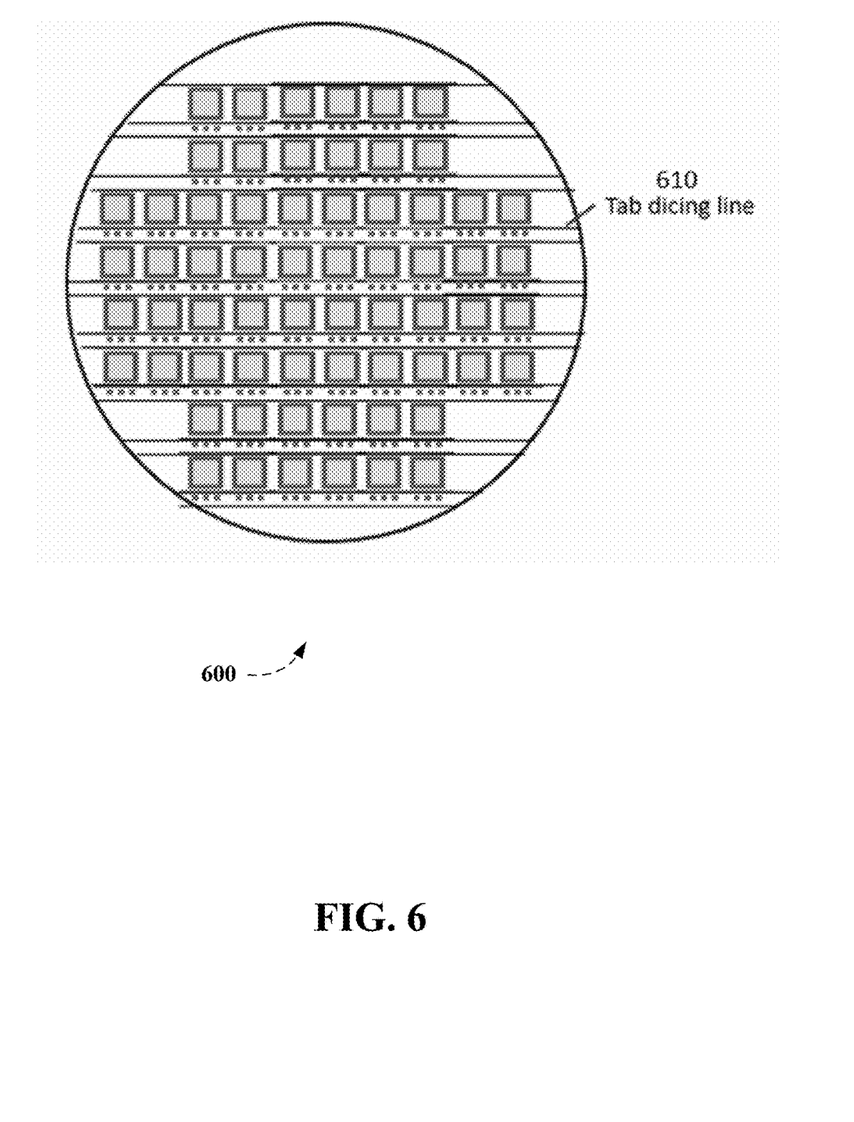
FIG. 6 illustrates an exploded top view of a bonded wafer in accordance with an embodiment.

FIG. 6 illustrates an exploded top view of a bonded wafer 600 in accordance with an embodiment. Similarly to FIG. 5, the bonded wafer 600 includes a plurality of core devices, a plurality of seal rings surrounding the plurality of core devices, and a plurality of bond pads (and each of the pluralities represent a single die).

In the bonded wafers of FIG. 5 and FIG. 6, there is no global wafer level edge seal. The wet chemicals can be trapped on the bond pads through the channels from the edge of the wafer which causes the bond pad (made from the AlCu compound material) corrosion issues that lead to the aforementioned bond pad defects and device failures.

A method for preparing a semiconductor wafer of a MEMS device to mitigate against bond pad defects is disclosed. In a first embodiment, the method comprises providing a passivation layer over a patterned top metal on the semiconductor wafer, etching the passivation layer to open a bond pad in the semiconductor wafer using a first mask, depositing a protection layer on the semiconductor wafer, patterning the protective layer using a second mask, and etching the passivation layer to open other electrodes in the semiconductor wafer using a third mask. The method further comprises bonding the semiconductor wafer to another wafer, exposing the bond pad, and etching the protection layer from the bond pad.

In one embodiment, the semiconductor wafer comprises a complementary metal-oxide-semiconductor (CMOS) wafer and the another wafer comprises a microelectromechanical systems (MEMS) wafer. In one embodiment, the bonding step uses eutectic bonding, the exposing step uses tab dicing, the protection layer is any of an oxide layer, a silicon nitride (SiN) layer, and a titanium nitride (TiN) layer, and the etching of the protection layer from the bond pad step uses any of isotropic etching and anisotropic etching.

In the first embodiment, to open both the bond pad (typically made of AlCu) and the other electrodes, the passivation layer (top passivation layer and oxide layer) and an anti-reflection layer (e.g., TiN) coupled on top of the AlCu are both etched.

In a second embodiment, the method for preparing a semiconductor wafer comprises providing a passivation layer over a patterned top metal on the semiconductor wafer, etching the passivation layer to open a bond pad in the semiconductor wafer using a first mask, depositing a protection layer on the semiconductor wafer, wherein the protection layer is the same material as a top passivation layer of the passivation layer, and etching the passivation layer to open other electrodes in the semiconductor wafer using a second mask.

In the second embodiment, to open both the bond pad (typically made of AlCu) and the other electrodes, the passivation layer (top passivation layer and oxide layer) and an anti-reflection layer (e.g., TiN) coupled on top of the AlCu are both etched.

In one embodiment, the semiconductor wafer comprises a complementary metal-oxide-semiconductor (CMOS) wafer and the another wafer comprises a microelectromechanical systems (MEMS) wafer. In one embodiment, the bonding step uses eutectic bonding, the exposing step uses tab dicing, the protection layer is a silicon nitride (SiN) layer, and the etching of the protection layer from the bond pad step uses any of isotropic etching and anisotropic etching.

In a third embodiment, the method for preparing a semiconductor wafer comprises providing a passivation layer over a patterned top metal on the semiconductor wafer, etching the passivation layer to partially open a bond pad in the semiconductor wafer using a first mask, and etching the passivation layer to open other electrodes in the semiconductor wafer using a second mask.

In the third embodiment, to open the other electrodes, the passivation layer (top passivation layer and oxide layer) and an anti-reflection layer (e.g., TiN) coupled on top of the AlCu are both etched. To open the bond pad, only the passivation layer (not the anti-reflection layer) is etched.

In one embodiment, the semiconductor wafer comprises a complementary metal-oxide-semiconductor (CMOS) wafer and the another wafer comprises a microelectromechanical systems (MEMS) wafer. In one embodiment, the bonding step uses eutectic bonding, the exposing step uses tab dicing, the protection layer is a titanium nitride (TiN) layer, and the etching of the protection layer from the bond pad step uses any of isotropic etching and anisotropic etching.

In a fourth embodiment, the method for preparing a semiconductor wafer comprises providing a passivation layer over a patterned top metal on the semiconductor wafer, etching the passivation layer to open a bond pad and other electrodes in the semiconductor wafer at the same time using a first mask, depositing a protection layer on the semiconductor wafer, and etching the protection layer to open other electrodes in the semiconductor wafer using a second mask.

In one embodiment, the semiconductor wafer comprises a complementary metal-oxide-semiconductor (CMOS) wafer and the another wafer comprises a microelectromechanical systems (MEMS) wafer. In one embodiment, the bonding step uses eutectic bonding, the exposing step uses tab dicing, the protection layer is any of an oxide layer, a silicon nitride (SiN) layer, and a titanium nitride (TiN) layer, and the etching of the protection layer from the bond pad step uses any of isotropic etching and anisotropic etching.

In the fourth embodiment, to open both the bond pad (typically made of AlCu) and the other electrodes, the passivation layer (top passivation layer and oxide layer) and an anti-reflection layer (e.g., TiN) coupled on top of the AlCu are both etched.

In one embodiment, a MEMS device with a semiconductor wafer that has been prepared to mitigate against bond pad defects is disclosed. The MEMS device comprises a first substrate and a second substrate bonded to the first substrate. In this embodiment, the second substrate is prepared by the method of any of the aforementioned first embodiment, the second embodiment, the third embodiment, and the fourth embodiment.

In one embodiment, the second substrate is a semiconductor wafer that comprises a complementary metal-oxide-semiconductor (CMOS) wafer and the first substrate is an another wafer that comprises a microelectromechanical systems (MEMS) wafer. In one embodiment, the bonding step uses eutectic bonding, the exposing step uses tab dicing, the protection layer is any of an oxide layer, a silicon nitride (SiN) layer, and a titanium nitride (TiN) layer, and the etching of the protection layer from the bond pad step uses any of isotropic etching and anisotropic etching.

As above described, a method and system in accordance with the present invention provides for preparing of a semiconductor wafer to mitigate against bond pad defects. As opposed to applying a protective/protection layer after the semiconductor wafer (e.g., CMOS wafer) is bonded to a MEMS wafer which results in the bond pad being more susceptible to defects when a more detailed backend process that includes wet steps is conducted, the method in accordance with the present invention applies the protective/protection layer before the CMOS wafer is bonded to the MEMS wafer and then selectively etches the protection layer away after the more detailed backend process is conducted.

The conventional process module utilizes a SAM coating that is a mono-layer and is applied after wafer bonding occurs (between the CMOS wafer and the MEMS wafer). In this conventional process module, deposition of the SAM coating must be extremely conformal and penetrates through the channels from the edge of the wafer. The methods in accordance with the present invention provide a more robust protective layer directly on CMOS wafer prior to bonding with the MEMS wafer.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method, comprising:
   depositing a protection layer over an etched passivation layer and at least one bond pad on a semiconductor wafer, wherein the depositing comprises patterning the protection layer such that it is in contact with the at least one bond pad and removed from at least one other bond pad;
   bonding the semiconductor wafer to another wafer; and
   etching the protection layer from the at least one bond pad of the semiconductor wafer.

2. The method of claim 1, wherein the depositing the protection layer comprises depositing a non-conductive protection layer.

3. The method of claim 1, wherein the depositing the protection layer comprises depositing at least one of an oxide layer, a silicon nitride (SiN) layer, or a titanium nitride (TiN) layer.

4. The method of claim 1, wherein the depositing the protection layer comprises depositing a material employed as the etched passivation layer of the semiconductor wafer, wherein the etched passivation layer is disposed over a top metal layer of the semiconductor wafer.

5. The method of claim 4, further comprising:
   etching the passivation layer to create the etched passivation layer and to open the at least one bond pad in the semiconductor wafer using a first mask; and
   wherein the patterning the protection layer comprises patterning the protection layer using a second mask.

6. The method of claim 1, wherein the etching the protection layer from the at least one bond pad comprises at least one of isotropic etching or anisotropic etching the protection layer.

7. The method of claim 1, wherein the etching the protection layer comprises etching the protection layer from at least one electrode.

8. The of claim 1, wherein the bonding the semiconductor wafer to the another wafer comprises bonding the semiconductor wafer comprising a complementary metal-oxide-semiconductor (CMOS) wafer to the another wafer comprising a micro-electro-mechanical systems (MEMS) wafer.

9. A method, comprising:
   etching a passivation layer to expose at least one bond pad in a semiconductor wafer;
   depositing a protection layer on the semiconductor wafer over the at least one bond pad; and
   etching the protection layer from the at least one bond pad of the semiconductor wafer.

10. The method of claim 9, wherein the depositing the protection layer comprises depositing a non-conductive protection layer comprising at least one of an oxide layer, a silicon nitride (SiN) layer, or a titanium nitride (TiN) layer.

11. The method of claim 9, wherein the depositing the protection layer comprises depositing a material comprising the passivation layer of the semiconductor wafer, wherein the passivation layer is disposed over a top metal layer of the semiconductor wafer comprising a complementary metal-oxide-semiconductor (CMOS) wafer.

12. The method of claim 9, further comprising:
    etching the passivation layer to open the at least one bond pad in the semiconductor wafer using a first mask; and
    patterning the protection layer using a second mask.

13. The method of claim 9, wherein the etching the protection layer comprises etching the protection layer from at least one electrode.

14. A semiconductor wafer, comprising:
    an intermetal dielectric layer;
    at least one electrode of a top metal layer of the semiconductor wafer disposed over the intermetal dielectric layer;
    an oxide layer disposed over the intermetal dielectric layer and adjacent to the at least one electrode;
    a top passivation layer disposed over the oxide layer, wherein the top passivation layer and the oxide layer are configured in a pattern defined via a first mask to create a patterned passivation layer and a patterned oxide layer proximate the at least one electrode; and
    a protection layer disposed over the patterned passivation layer, wherein the protection layer is configured to protect the at least one electrode, and wherein the protection layer is patterned to expose at least one other electrode.

15. The semiconductor wafer of claim 14, wherein the protection layer comprises a non-conductive protection layer comprising at least one of an oxide layer, a silicon nitride (SiN) layer, or a titanium nitride (TiN) layer.

16. The semiconductor wafer of claim 14, wherein the protection layer is further configured in a pattern defined via a second mask.

17. The semiconductor wafer of claim 14, wherein the protection layer comprises a material comprising the top passivation layer of the semiconductor wafer.

18. The semiconductor wafer of claim 17, wherein the at least one electrode corresponds to at least one of a bond pad for a sensing electrode, a bond seal of a complementary micro-electro-mechanical systems (MEMS) wafer or an electrode of the semiconductor wafer comprising a complementary metal-oxide-semiconductor (CMOS) wafer.

19. The semiconductor wafer of claim 18, wherein the passivation layer and the oxide layer are further configured in a pattern defined via third mask that exposes at least one of the at least one other electrode or the intermetal dielectric layer, wherein the at least one other electrode corresponds to the at least one of the bond pad for the sensing electrode or the bond seal of the complementary MEMS wafer.

20. The semiconductor wafer of claim 14, wherein the top passivation layer comprises silicon nitride (SiN).

* * * * *